(12) United States Patent
Iwaki

(10) Patent No.: US 9,270,263 B2
(45) Date of Patent: Feb. 23, 2016

(54) SWITCHING DEVICE AND MODULE

(71) Applicant: TAIYO YUDEN CO., LTD., Tokyo (JP)

(72) Inventor: Masafumi Iwaki, Tokyo (JP)

(73) Assignee: TAIYO YUDEN CO., LTD., Tokyo (JP)

( * ) Notice: Subject to any disclaimer, the term of this patent is extended or adjusted under 35 U.S.C. 154(b) by 0 days.

(21) Appl. No.: 14/301,051

(22) Filed: Jun. 10, 2014

(65) Prior Publication Data

US 2015/0022257 A1 Jan. 22, 2015

(30) Foreign Application Priority Data

Jul. 18, 2013 (JP) .................................. 2013-149817

(51) Int. Cl.
| | | |
|---|---|---|
| *H03K 17/687* | (2006.01) | |
| *H03K 17/16* | (2006.01) | |
| *H03K 17/693* | (2006.01) | |
| *H04B 1/48* | (2006.01) | |
| *H03K 17/06* | (2006.01) | |

(52) U.S. Cl.
CPC .............. *H03K 17/16* (2013.01); *H03K 17/693* (2013.01); *H03K 2017/066* (2013.01); *H04B 1/48* (2013.01)

(58) Field of Classification Search
USPC .................................................. 327/365–508
See application file for complete search history.

(56) References Cited

U.S. PATENT DOCUMENTS

| | | | | |
|---|---|---|---|---|
| 6,181,184 B1* | 1/2001 | Yamazaki et al. | ............ | 327/278 |
| 7,459,988 B1* | 12/2008 | Iversen | ......................... | 333/103 |
| 7,848,712 B2 | 12/2010 | Fu et al. | | |
| 8,604,864 B2* | 12/2013 | Ranta et al. | .................... | 327/427 |
| 2005/0159113 A1* | 7/2005 | Iida | .................. | 455/78 |
| 2011/0105055 A1* | 5/2011 | Ilkov | ............... | 455/93 |
| 2011/0248768 A1* | 10/2011 | Huang | ......................... | 327/427 |

FOREIGN PATENT DOCUMENTS

JP  2006-109084 A  4/2006

* cited by examiner

*Primary Examiner* — Brandon S Cole
(74) *Attorney, Agent, or Firm* — Chen Yoshimura LLP

(57) ABSTRACT

A switching device includes: a switch that selects and connects one of at least three terminals including a first terminal, a second terminal, and a third terminal to a common terminal; and a compensating circuit that shifts a phase of at least one of a first signal transmitted through the second terminal and a second signal transmitted through the third terminal so that the first signal and the second signal compensate each other and unifies and outputs the first signal and the second signal to a fourth terminal as a third signal, or that branches a third signal input to the fourth terminal into the first signal and the second signal.

10 Claims, 18 Drawing Sheets

SWITCHING DEVICE AND MODULE

CROSS-REFERENCE TO RELATED APPLICATION

This application is based upon and claims the benefit of priority of the prior Japanese Patent Application No. 2013-149817, filed on Jul. 18, 2013, the entire contents of which are incorporated herein by reference.

FIELD

A certain aspect of the present invention relates to a switching device and a module.

BACKGROUND

Rapid diffusion of wireless devices typified by mobile phones has promoted the use of switching devices. For example, high-frequency switches have been used in mobile terminals for high frequency communication to select high-frequency signals. Examples of the switch include mechanical switches and switches using a semiconductor transistor, for example.

Japanese Patent Application Publication No. 2006-109084 (Patent Document 1) and U.S. Pat. No. 7,848,712 (Patent Document 2) disclose providing an inductor between input/output terminals of a switch to improve isolation characteristics between the input/output terminals.

The technologies disclosed in Patent Documents 1 and 2 can cancel out the parasitic capacitance between the input/output terminals by the reactance component of the inductor, and thereby can improve the isolation characteristics. However, the parasitic capacitance value between the input/output terminals is small. Hence the effort to improve the isolation characteristics leads to the increase in the inductance of the inductor. Therefore, the above-described technologies are not practical.

SUMMARY OF THE INVENTION

According to an aspect of the present invention, there is provided a switching device including: a switch that selects and connects one of at least three terminals including a first terminal, a second terminal, and a third terminal to a common terminal; and a compensating circuit that shifts a phase of at least one of a first signal transmitted through the second terminal and a second signal transmitted through the third terminal so that the first signal and the second signal compensate each other and unifies and outputs the first signal and the second signal to a fourth terminal as a third signal, or that branches a third signal input to the fourth terminal into the first signal and the second signal.

According to another aspect of the present invention, there is provided a switching device including: a switch that selects and connects one of at least two terminals including a first terminal and a second terminal to a common terminal; a capacitor connected between at least one of the first terminal and the common terminal and a third terminal; and a compensating circuit that shifts a phase of at least one of a first signal transmitted through the second terminal and a second signal transmitted through the third terminal so that the first signal and the second signal compensate each other and unifies and outputs the first signal and the second signal to a fourth terminal as a third signal, or that branches a third signal input to the fourth terminal into the first signal and the second signal.

According to another aspect of the present invention, there is provided a module including: the above switching device.

DETAILED DESCRIPTION

Hereinafter, a description will be given of embodiments with reference to the drawings.

First Embodiment

Figure 1A:
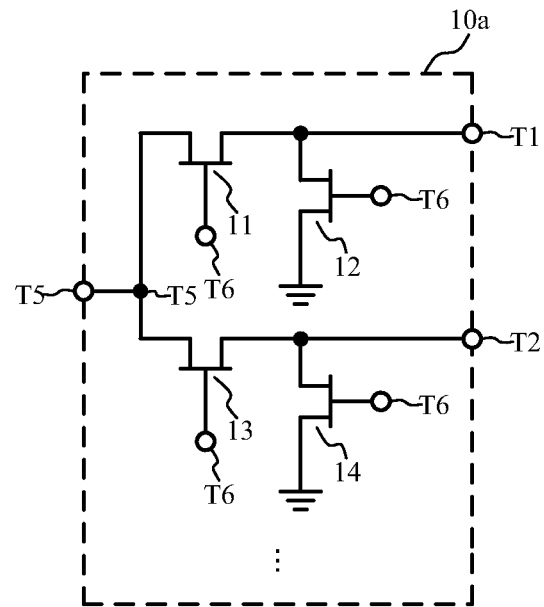
FIG. 1A is a circuit diagram of a switch used in a switching device.
Figure 1B:
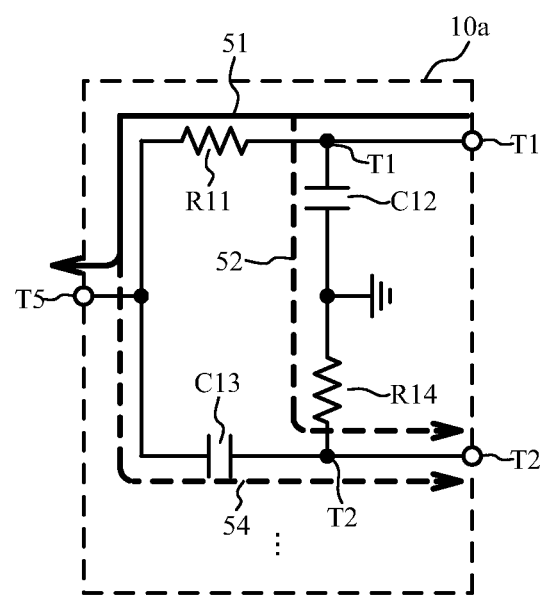
FIG. 1B is an equivalent circuit diagram.

A description will be given of a semiconductor switch as an example of a switch used in a switching device. FIG. 1A is a circuit diagram of a switch used in a switching device, and FIG. 1B is an equivalent circuit diagram. As illustrated in FIG. 1A, a switch 10a includes transistors 11 through 14. The source of the transistor 11 is coupled to a terminal T1 while the drain thereof is coupled to a terminal T5. The source of the transistor 13 is coupled to a terminal T2 while the drain thereof is coupled to the terminal T5. The source of the transistor 12 is coupled to the terminal T1 while the drain thereof is coupled to a ground. The source of the transistor 14 is coupled to the terminal T2 while the drain thereof is coupled to a ground. The gates of the transistors 11 through 14 are coupled to control terminals T6. The sources and the drains of the transistors 11 through 14 may replace each other.

As illustrated in FIG. 1B, control signals supplied to the control terminals T6 turn the transistors 11 and 14 ON and turn the transistors 12 and 13 OFF. The transistors 11 and 14 are equivalently represented as resistors R11 and R14 (on-resistance), and the transistors 12 and 13 are equivalently represented as capacitors C12 and C13 (off-capacitance). The capacitors C12 and C13 are, for example, parasitic capacitances between the source and the drain through a semiconductor substrate. The terminal T1 is coupled to the terminal T5, and the terminal T2 is disconnected from the terminal T5. As described above, the switch 10a selects and connects one of the input/output terminals T1 and T2 to the terminal T5. Thereby, a high-frequency signal 51 input from the terminal T1 is output to the terminal T5, or a high-frequency signal input from the terminal T5 is output to the terminal T1. A signal 52 that is a part of the high-frequency signal leaks from the terminal T1 to the terminal T2 through the capacitor C12. A signal 54 that is a part of the high-frequency signal leaks from the terminal T1 to the terminal T2 through the capacitor C13. This degrades the isolation between the terminals T1 and T2.

Figure 2A:
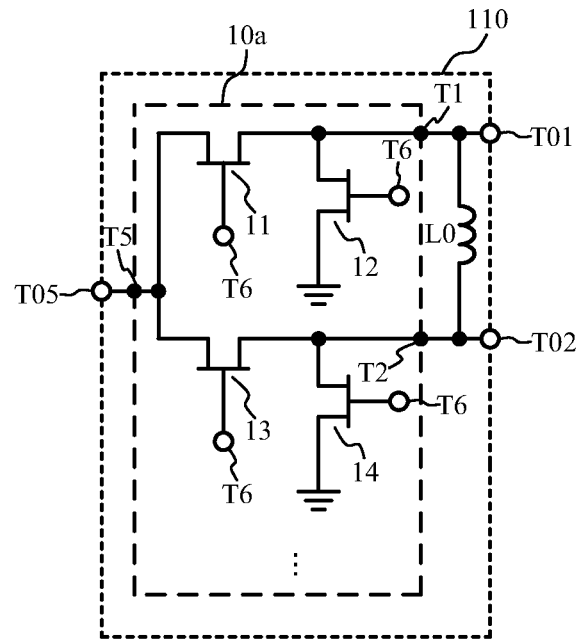
FIG. 2A is a circuit diagram of a switching device in accordance with a comparative example.
Figure 2B:
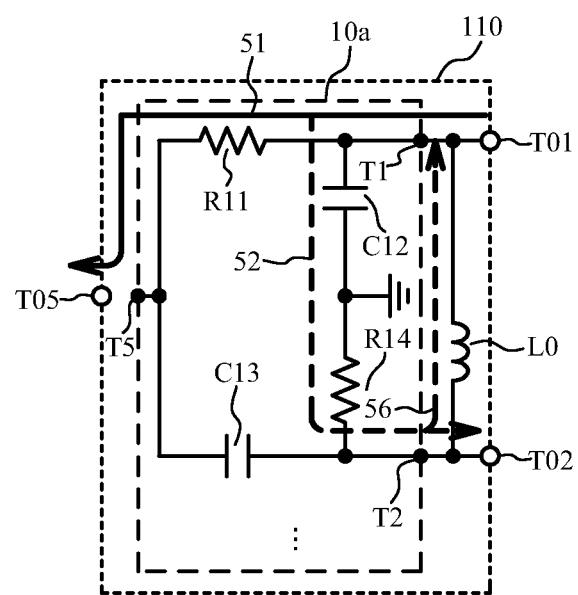
FIG. 2B is an equivalent circuit diagram.

FIG. 2A is a circuit diagram of a switching device in accordance with a comparative example, and FIG. 2B is an equivalent circuit diagram. As illustrated in FIG. 2A, a switching device 110 includes the switch 10a and an inductor L0. The inductor L0 is connected between the terminals T1 and T2. The terminals T1, T2 and T5 of the switch 10a are coupled to input/output terminals T01, T02 and a common terminal T05 of the switching device, respectively. The configuration of the switch 10a is the same as that of FIG. 1A, and a description thereof is omitted.

As illustrated in FIG. 2B, the signal 52 leaking from the terminal T1 to the terminal T2 comes back to the terminal T1 through the inductor L0. As described above, the formation of an LC notch circuit suppresses a leakage of the signal 52 to the terminal T2. The signal 54 illustrated in FIG. 1B is suppressed in the same manner. Therefore, the isolation is improved. However, the transistors 12 and 13 have low off-capacitances C12 and C13. Hence, the effort to sufficiently suppress the signal 52 leads to the increase in the inductance of the inductor L0. This results in the increase in the size of the switching device 110.

Figure 3:
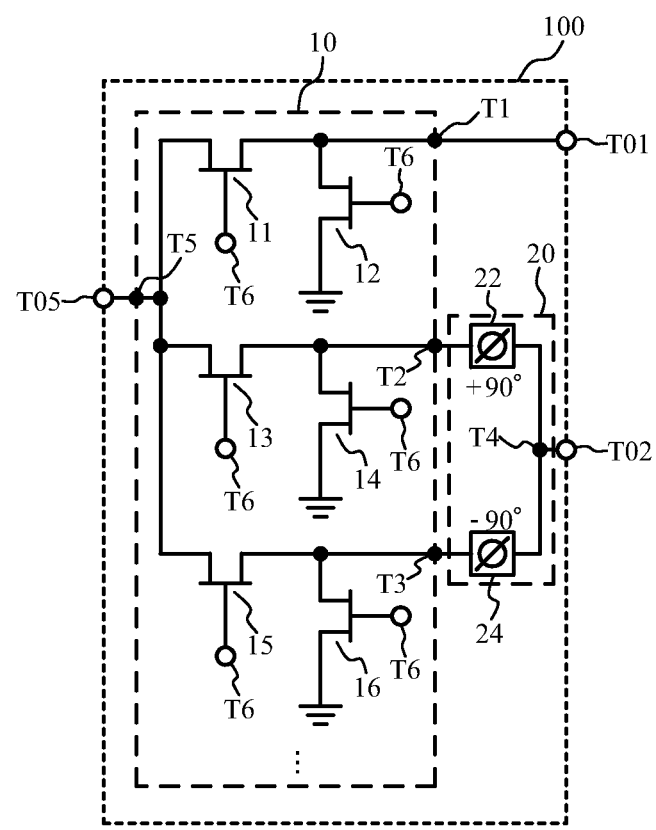
FIG. 3 is a circuit diagram of a switching device in accordance with a first embodiment.

FIG. 3 is a circuit diagram of a switching device in accordance with a first embodiment. As illustrated in FIG. 3, a switching device 100 includes a switch 10, a compensating circuit 20, the input/output terminals T01 and T02, and the common terminal T05. The switch 10 includes transistors 11 through 16. The transistors 11, 13 and 15 are connected in series between the terminals T1, T2 and T3 and the terminal T5, respectively. The transistors 12, 14 and 16 are connected in shunt between the terminals T1, T2 and T3 and the terminal T5, respectively. The gates of the transistors 11 through 16 are coupled to the control terminals T6.

The switch 10 selects and connects one of at least three terminals including the terminal T1 (a first terminal), the terminal T2 (a second terminal), and the terminal T3 (a third terminal) to the terminal T4 (a common terminal) based on the control signal applied to the control terminal T6. For example, when the terminal T1 is coupled to the terminal T5, the transistors 11, 14 and 16 are turned ON and the transistors 12, 13 and 15 are turned OFF. When the terminal T2 is coupled to the terminal T5, the transistors 12, 13 and 16 are turned ON and the transistors 11, 14 and 15 are turned OFF. When the terminal T3 is coupled to the terminal T5, the transistors 12, 14 and 15 are turned ON and the transistors 11, 13 and 16 are turned OFF. The switch 10 is a semiconductor switch or a mechanical switch. The transistors 11 through 16 for the semiconductor switch may be an FET such as a MOSFET (Metal Oxide Semiconductor Field Effect Transistor) or a bipolar transistor.

The compensating circuit 20 includes phase shifting circuits 22 and 24. The phase shifting circuit 22 shifts the phase of a signal transmitted through the terminal T2 by +90°. The phase shifting circuit 24 shifts the phase of a signal transmitted through the terminal T3 by -90°. The terminal T4 is a terminal formed by unifying the terminal T2 and the terminal T3 by the compensating circuit 20. The input/output terminals T01 and T02 are coupled to the terminals T1 and T4, respectively. The common terminal T05 is coupled to the terminal T5.

Figure 4:
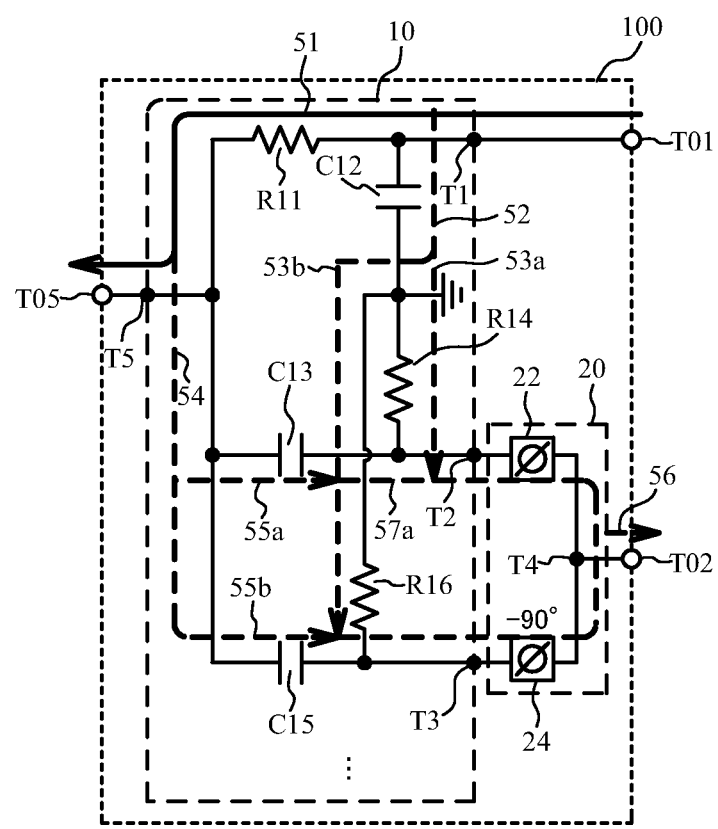
FIG. 4 is an equivalent circuit diagram of the switching device in accordance with the first embodiment.

FIG. 4 is an equivalent circuit diagram of the switching device of the first embodiment. As illustrated in FIG. 4, when the terminal T1 is coupled to the terminal T5, the transistors 11, 14 and 16 are turned ON and the transistors 12, 13 and 15 are turned OFF. The transistors 11, 14 and 16 are equivalently represented as resistors R11, R14 and R16, and the transistors 12, 13 and 15 are equivalently represented as capacitors C12, C13 and C15. The signal 52 that is a part of the high-frequency signal 51 leaks to the terminals T2 and T3 through the capacitor C12. The signal 52 is branched into signals 53a and 53b. The signal 54 that is a part of the high-frequency signal 51 is branched into signals 55a and 55b, and the signals 55a and 55b leak to the terminals T2 and T3 through the capacitor C13 and C15, respectively. Signals 57a and 57b are transmitted through the terminals T2 and T3, respectively. The signal 57a is a synthesized signal of the signals 53a and 55a while the signal 57b is a synthesized signal of the signals 53b and 55b.

When the transistors 13 and 15 have approximately the same size and the transistors 14 and 16 have approximately the same size, the signals 57a and 57b have approximately the same amplitude and the same phase. The phase shifting circuit 22 shifts the phase of the signal 57a by 90° and the phase shifting circuit 24 shifts the phase of the signal 57b by -90°. In the terminal T4, the signals 57a and 57b are synthesized, and output to the input/output terminal T02 as a signal 56. When the signal 57a and the signal 57b having approximately the same amplitude and opposite phases are synthesized, the signals 52 and 54 are almost cancelled out and the signal 56 is suppressed. As a result, the isolation from the terminal T01 to the terminal T02 is improved.

Figure 5A:
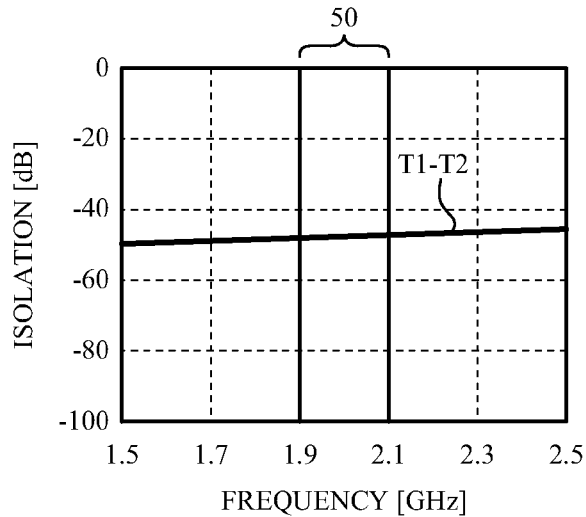
FIG. 5A through FIG. 5C are diagrams illustrating isolation, $|Y21|$, and $\angle Y21$ between input/output terminals of the switch, respectively.
Figure 5B:
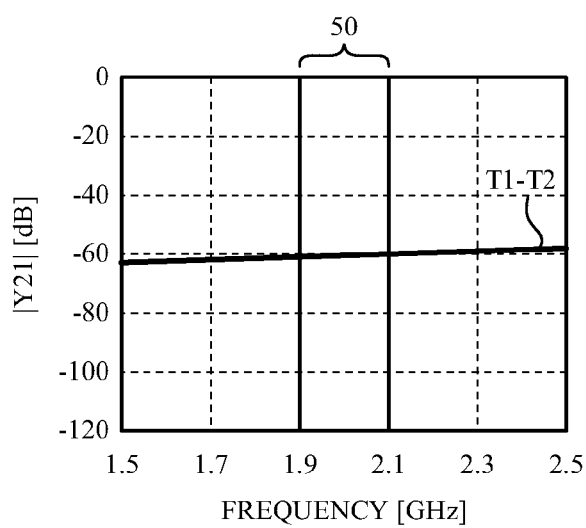
Figure 5C:
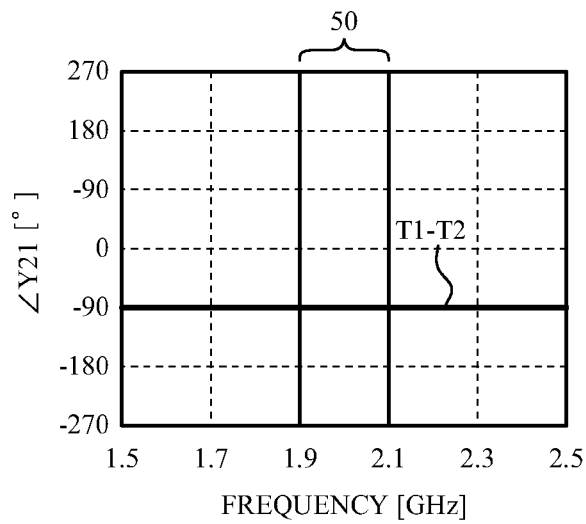

FIG. 5A through FIG. 5C are diagrams illustrating isolation, |Y21|, and ∠Y21 between the input/output terminals of the switch, respectively. The switch 10 is a switch using a CMOSFET (Complimentary MOSFET). The isolation is isolation (S21) between the terminals T1 and T2 of the switch 10 in FIG. 3. |Y21| is the amplitude of Y21 between the terminals T1 and T2. ∠Y21 is the phase of Y21 between the terminals T1 and T2. The isolation, |Y21|, and ∠Y21 were simulated at frequencies of from 1.5 GHz to 2.5 GHz. A band 50 is a band in which the isolation characteristics are improved, and is, for example, a transmit band and/or a receive band of a mobile terminal employing the switching device.

As illustrated in FIG. 5A, the isolation in the band 50 is approximately -45 dB. As illustrated in FIG. 5B, |Y21| in the band 50 is approximately -60 dB. As illustrated in FIG. 5C, ∠Y21 in the band 50 is approximately -90°. As described above, there is a capacitive reactance component (i.e. a parasitic capacitance) between the terminals T1 and T2.

Figure 6A:
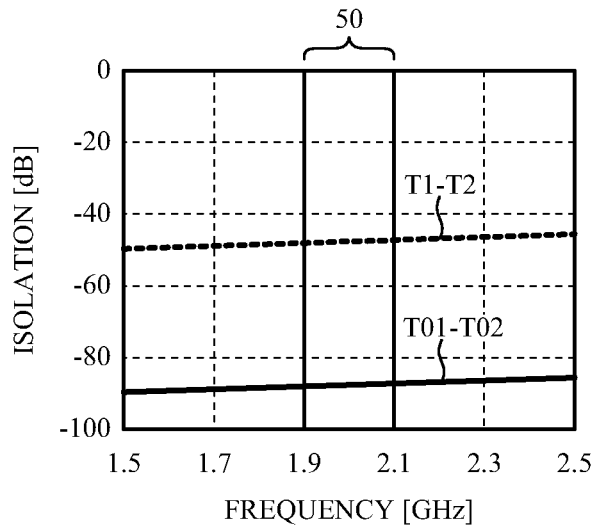
FIG. 6A through FIG. 6C are diagrams illustrating isolation, $|Y21|$, and $\angle Y21$ of the switching device of the first embodiment, respectively.
Figure 6B:
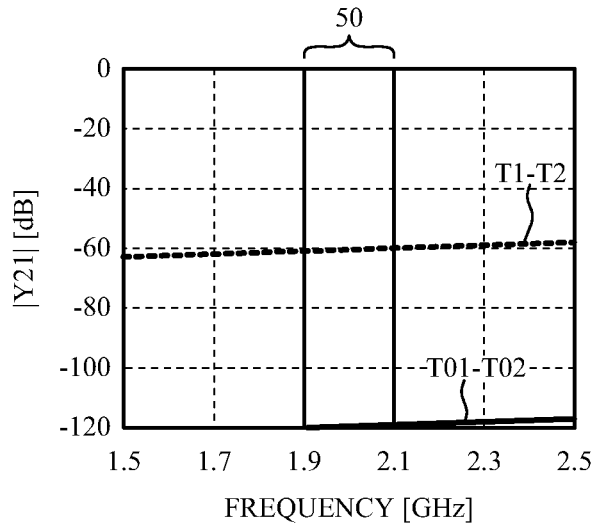
Figure 6C:
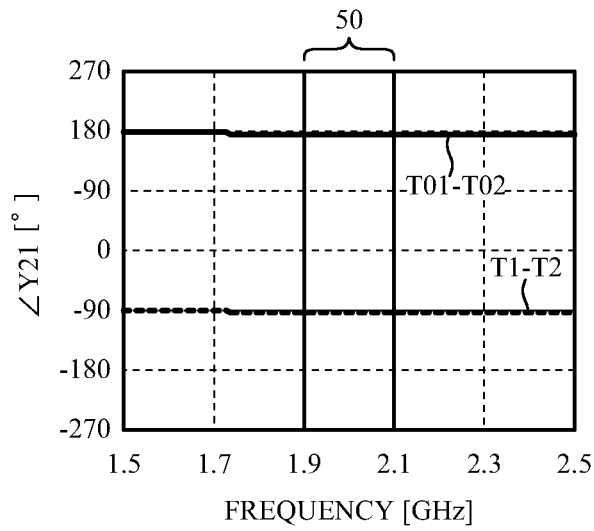

FIG. 6A through FIG. 6C are diagrams illustrating isolation, |Y21|, and ∠Y21 of the switching device of the first embodiment, respectively. The solid lines indicate characteristics between the input/output terminals T01 and T02 of the switching device 100 (denoted as T01-T02), and the dotted lines indicate characteristics between the terminals T1 and T2 of the switch 10 (denoted as T1-T2) presented in FIG. 5A through FIG. 5C. The phase shifting circuits 22 and 24 are assumed to be ideal circuits that shift the phases by 90° and −90° within a range of frequencies from 1.5 GHz to 2.5 GHz, respectively. As illustrated in FIG. 6A, the isolation of the switching device 100 in the band 50 is approximately −90 dB. As illustrated in FIG. 6B, |Y21| of the switching device 100 in the band 50 is approximately −120 dB. As illustrated in FIG. 6C, ∠Y21 of the switching device 100 in the band 50 is approximately +180°. As described above, the first embodiment improves the isolation by approximately 45 dB from that of the switch 10.

Second Embodiment

Figure 7:
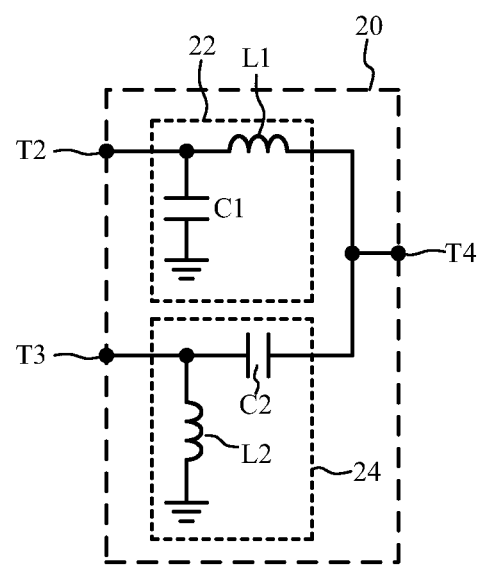
FIG. 7 is a circuit diagram of a compensating circuit employed in a second embodiment.

The second embodiment uses an inductor and a capacitor as the compensating circuit. FIG. 7 is a circuit diagram of a compensating circuit employed in the second embodiment. As illustrated in FIG. 7, the phase shifting circuit 22 includes an inductor L1 and a capacitor C1. The inductor L1 is connected in series between the terminals T2 and T4. The capacitor C1 is connected in shunt between the terminals T2 and T4. The phase shifting circuit 24 includes an inductor L2 and a capacitor C2. The capacitor C2 is connected in series between the terminals T3 and T4. The inductor L2 is connected in shunt between the terminals T3 and T4.

Figure 8A:
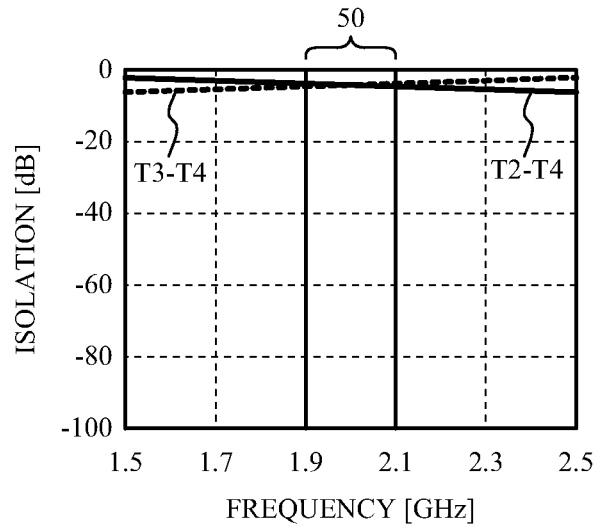
FIG. 8A through FIG. 8C are diagrams illustrating isolation, $|Y21|$, and $\angle Y21$ between terminals, respectively.
Figure 8B:
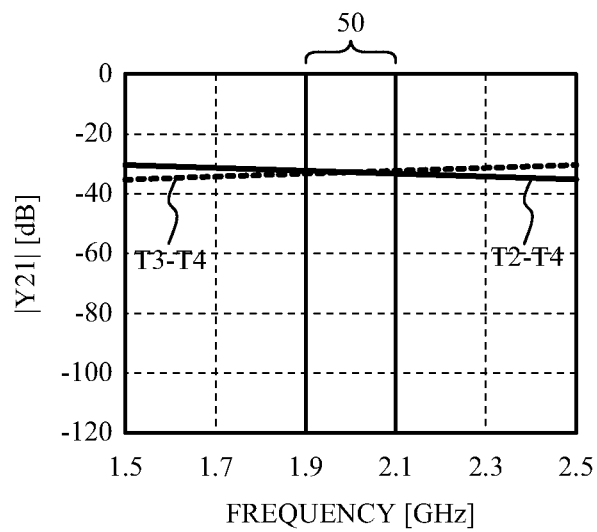
Figure 8C:
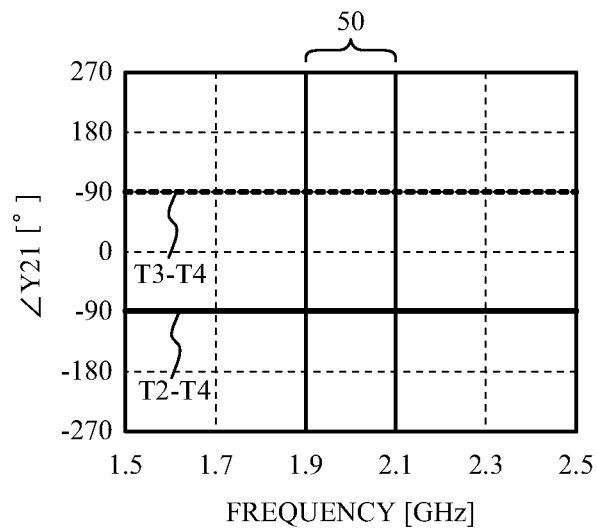

A simulation was performed under the following condition.
Inductance of L1: 4 nH
Capacitance of C1: 1.6 pF
Inductance of L2: 4 nH
Capacitance of C2: 1.6 pF FIG. 8A through FIG. 8C are diagrams illustrating isolation, |Y21|, and ∠Y21 between the terminals, respectively. The solid lines indicate characteristics between the terminals T2 and T4 (denoted as T2-T4), and the dashed lines indicate characteristics between the terminals T3 and T4 (denoted as T3-T4). As illustrated in FIG. 8A and FIG. 8B, the isolation and |Y21| between the terminals T2 and T4 are approximately the same as those between the terminals T3 and T4. Accordingly, the amplitudes of signals transmitted through the phase shifting circuits 22 and 24 are approximately the same. As illustrated in FIG. 8C, ∠Y21 is −90° between the terminals T2 and T4 and is +90° between the terminals T3 and T4. Accordingly, the phases of signals transmitted through the phase shifting circuits 22 and 24 are approximately opposite to each other.

Figure 9:
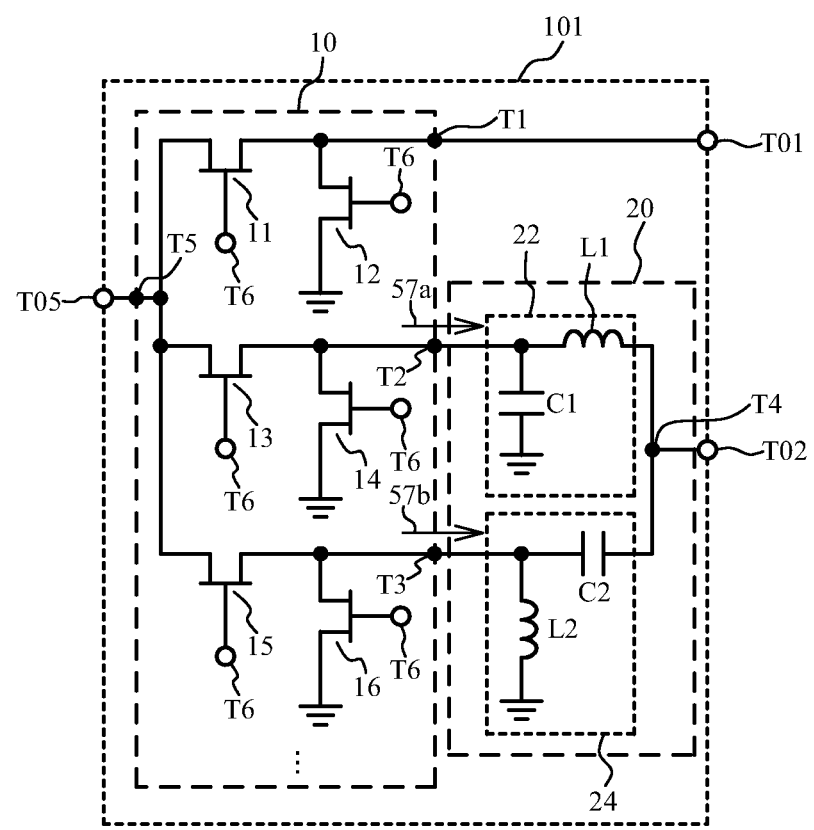
FIG. 9 is a circuit diagram of a switching device in accordance with the second embodiment.

FIG. 9 is a circuit diagram of a switching device in accordance with the second embodiment. As illustrated in FIG. 9, a switching device 101 employs the compensating circuit 20 illustrated in FIG. 7 as the compensating circuit. The other configuration is the same as that of the first embodiment, and a description thereof is omitted.

Figure 10A:
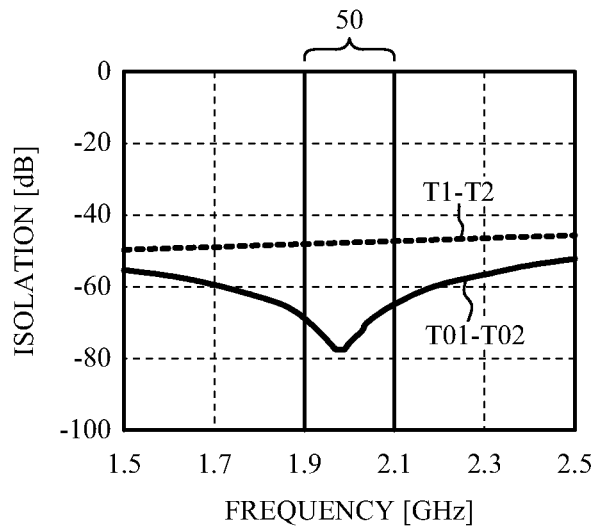
FIG. 10A through FIG. 10C are diagrams illustrating isolation, $|Y21|$, and $\angle Y21$ of the switching device of the second embodiment, respectively.
Figure 10B:
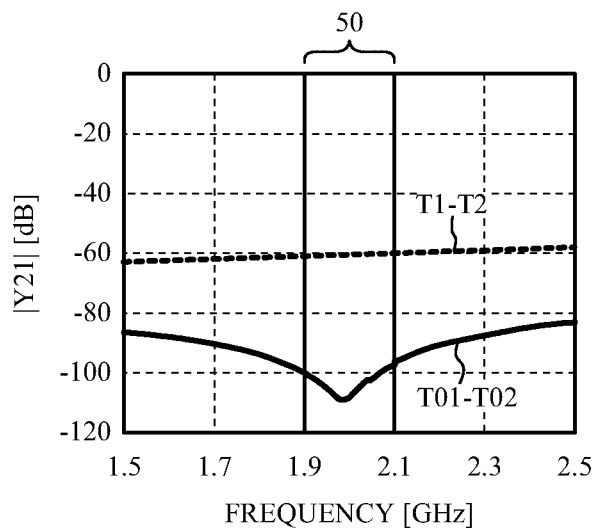
Figure 10C:
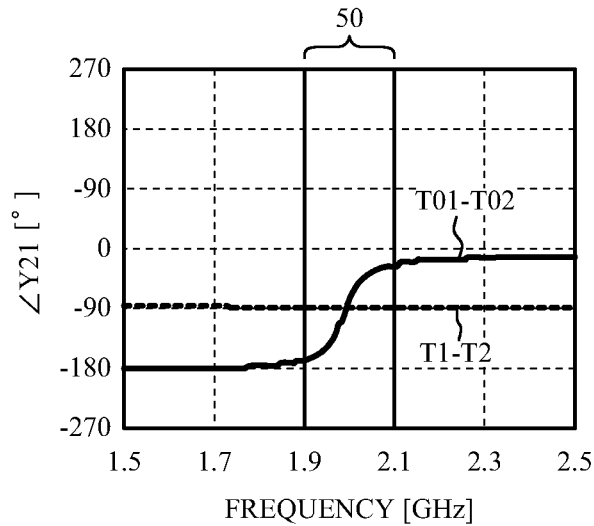

FIG. 10A through FIG. 10C are diagrams illustrating isolation, |Y21|, and ∠Y21 of the switching device of the second embodiment. The solid lines indicate characteristics between the input/output terminals T01 and T02 of the switching device 101 (T01-T02), and the dotted lines indicate characteristics between the terminals T1 and T2 of the switch 10 (T1-T2) presented in FIG. 5A through FIG. 5C. The compensating circuit 20 has the same configuration as that illustrated in FIG. 8A through FIG. 8C. As illustrated in FIG. 10A, the isolation of the switching device 101 in the band 50 is from −65 dB to −75 dB. As illustrated in FIG. 10B, |Y21| of the switching device 101 in the band 50 is approximately −100 dB. As illustrated in FIG. 10C, ∠Y21 of the switching device 101 in the band 50 is from −180° to 0°. As described above, the second embodiment improves the isolation by approximately 30 dB from that of the switch 10.

Figure 11:
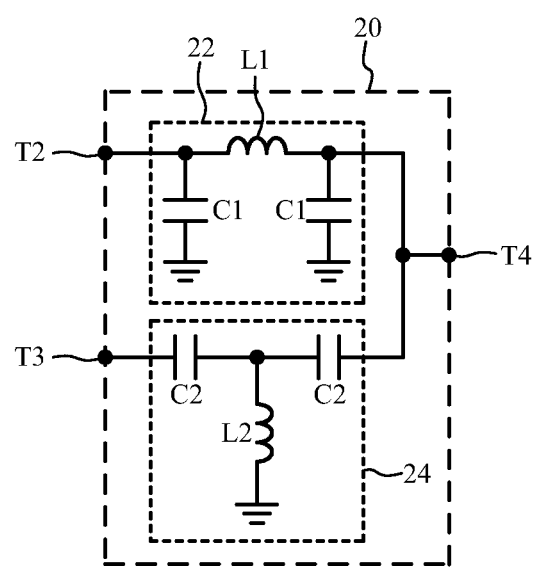
FIG. 11 is an alternative exemplary compensating circuit employed in the second embodiment.

FIG. 11 illustrates an alternative exemplary compensating circuit employed in the second embodiment. As illustrated in FIG. 11, the phase shifting circuit 22 is a C-L-C π-type circuit. The inductor L1 is connected in series between the terminals T2 and T4. The capacitors C1 are connected in shunt at both sides of the inductor L1. The phase shifting circuit 24 is a C-L-C T-type circuit. Two capacitors C2 are connected in series between the terminals T3 and T4. The inductor L2 is connected in shunt between the two capacitors C2. As illustrated in FIG. 7 and FIG. 11, the phase shifting circuits 22 and 24 can be formed by using reactance elements such as an inductor and a capacitor. This allows the compensating circuit 20 to be formed from chip components and to have a simple structure. When the number of inductors and capacitors decreases, the size can be reduced. When the number of inductors and capacitors increases, the band can be widen. In addition to the inductor and the capacitor, an element such as a distributed constant line or a chip balun that changes the phase of a signal can be used.

Third Embodiment

Figure 12:
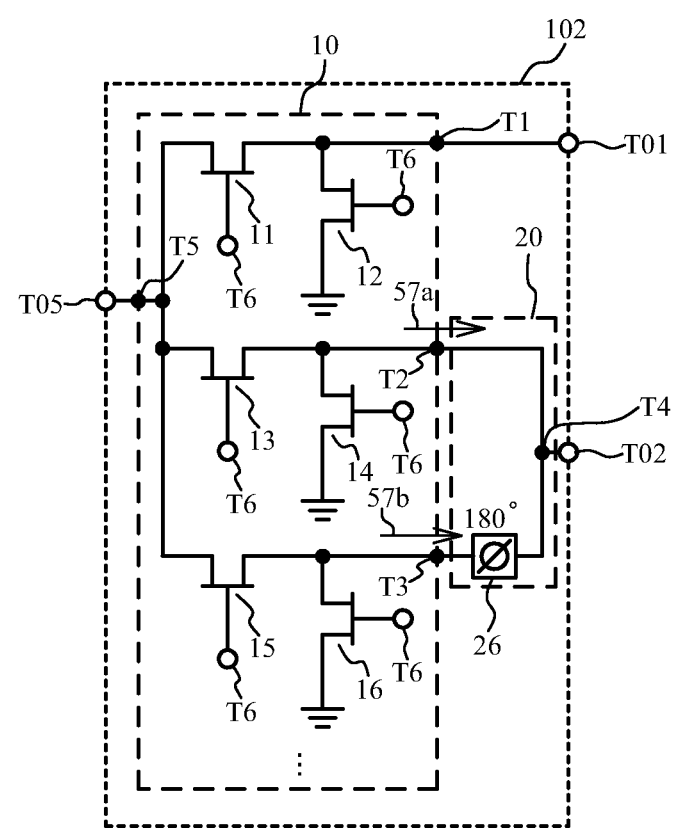
FIG. 12 is a circuit diagram of a switching device in accordance with a third embodiment.

A third embodiment uses a phase inverting circuit for the compensating circuit. FIG. 12 is a circuit diagram of a switching device in accordance with the third embodiment. As illustrated in FIG. 12, an element is not connected between the terminals T2 and T4 in the compensating circuit 20 of a switching device 102. Therefore, the phase of the signal 57a changes little. A phase inverting circuit 26 is connected between the terminals T3 and T4. The phase inverting circuit 26 shifts the phase of the signal 57b transmitted through the terminal T3 by 180°. The phase inverting circuit 26 can be formed by using reactance elements such as an inductor and a capacitor. The other configuration is the same as that of the first embodiment, and a description thereof is omitted.

In the first through third embodiments, the compensating circuit 20 shifts the phase of at least one of the signals 57a (a first signal) transmitted through the terminal T2 and the signal 57b (a second signal) transmitted through the terminal T3 so that the signal 57a and the signal 57b compensate each other. In addition, the compensating circuit 20 unifies and outputs the signal 57a and the signal 57b to the terminal T4 as the signal 56. As a result, the signal 57a transmitted through the terminal T2 and the signal 57b transmitted through the terminal T3 cancel out each other as illustrated in FIG. 4, and thereby the isolation characteristics between the input/output terminals T01 and T02 can be improved. When the phase difference between the signals 57a and 57b is greater than 90° and less than 270°, the signals 57a and 57b cancel out each other.

The compensating circuit 20 can reduce the leakage of a signal, which is input to the input/output terminal T02, to the input/output terminal T01 when the signal input to the input/output terminal T02 is output to the terminal T05. In this case, the compensating circuit 20 branches a signal input to the terminal T4 into the signal transmitted through the terminal T2 and the signal transmitted through the terminal T3. The compensating circuit 20 makes signals transmitted through the terminal T2 and the terminal T3 have practically opposite phases and then unifies them. This makes it possible to improve the isolation characteristics from the input/output terminal T02 to the input/output terminal T01.

In addition, the compensating circuit 20 makes the signal 57a and the signal 57b have practically opposite phases. For example, the phase difference between the signals 57a and 57b is preferably between 135° and 225°, and more preferably between 160° and 200°. In addition, the off-capacitances C13 and C15 of the transistors 13 and 15 are preferably practically the same. For example, the sizes of the transistors 13 and 15 are made to be the same. This makes the signal 57a and the signal 57b have practically the same amplitude.

As described in the first embodiment, the compensating circuit 20 may include the phase shifting circuit 22 located between the terminal T2 and the terminal T4 and shifting the phase of the signal 57a and the phase shifting circuit 24 located between the terminal T3 and the terminal T4 and shifting the phase of the signal 57b.

In addition, as described in the third embodiment, the compensating circuit 20 may include the phase inverting circuit 26 located between the terminal T2 and the terminal T4 or between the terminal T3 and the terminal T4 and practically inverting the phase of the signal 57a or 57b. As the number of the phase inverting circuit 26 is one, the third embodiment can reduce the size of the device more than the second embodiment.

Fourth Embodiment

Figure 13:
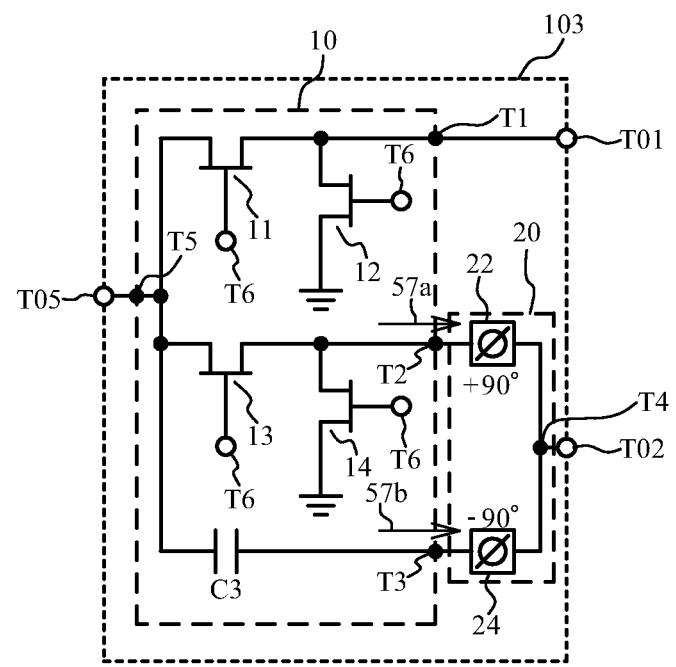
FIG. 13 is a circuit diagram of a switching device in accordance with a fourth embodiment.

A fourth embodiment uses a capacitor instead of the switches 15 and 16. FIG. 13 is a circuit diagram of a switching device in accordance with the fourth embodiment. As illustrated in FIG. 13, the switch 10 selects and connects one of at least two terminals including the terminals T1 and T2 to the terminal T5 in a switching device 103. Instead of the transistors 15 and 16, a capacitor C3 is connected in series between the terminals T5 and T3. The other configuration is the same as that of the first embodiment illustrated in FIG. 3, and a description thereof is omitted.

Figure 14:
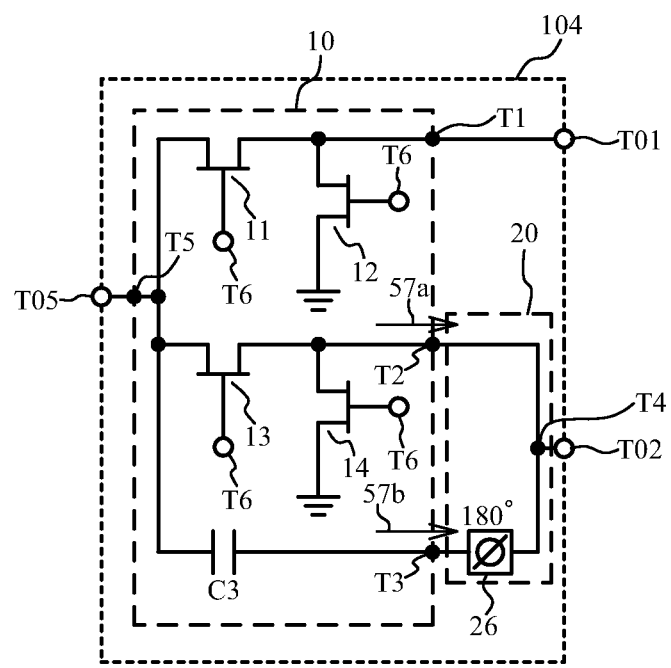
FIG. 14 is a circuit diagram of a switching device in accordance with a variation of the fourth embodiment.

FIG. 14 is a circuit diagram of a switching device in accordance with a variation of the fourth embodiment. As illustrated in FIG. 14, instead of the transistors 15 and 16, the capacitor C3 is connected in series between the terminals T5 and T3 in a switching device 104. The other configuration is the same as that of the third embodiment illustrated in FIG. 12, and a description is omitted.

As described in FIG. 4, the transistor 15 that is turned off is equivalent to the capacitor C15. Thus, the amplitude and the phase of the signal 57b can be made to be approximately the same as those of the signal 57b in FIG. 4 by appropriately setting the capacitance of the capacitor C3. For example, the capacitance of the capacitor C3 is made to be approximately the same as the off-capacitance of the transistor 15. This configuration prevents the leaking signal 54 transmitted from the terminal T1 through the terminal T5 from being output from the terminal T4. The fourth embodiment and the variation thereof can reduce the size of the device by using the capacitor C3 instead of the two transistors 15 and 16 of the first through third embodiments.

Although the capacitor C3 is connected between the terminal T5 and the terminal T3 in the above description, the capacitor C3 may be connected between the terminals T1 and T3. This prevents the leaking signal 52 transmitted from the terminal T1 through the transistor 12 from being output from the terminal T4. As described above, it is sufficient if the capacitor C3 is connected between at least one of the terminal T1 and the terminal T5 and the terminal T3.

In the fourth embodiment and the variation thereof, the compensating circuit 20 may use an element such as an inductor, a capacitor, a distributed constant circuit, or a chip balun that changes the phase of a signal as described in the second embodiment.

Fifth Embodiment

Figure 15:
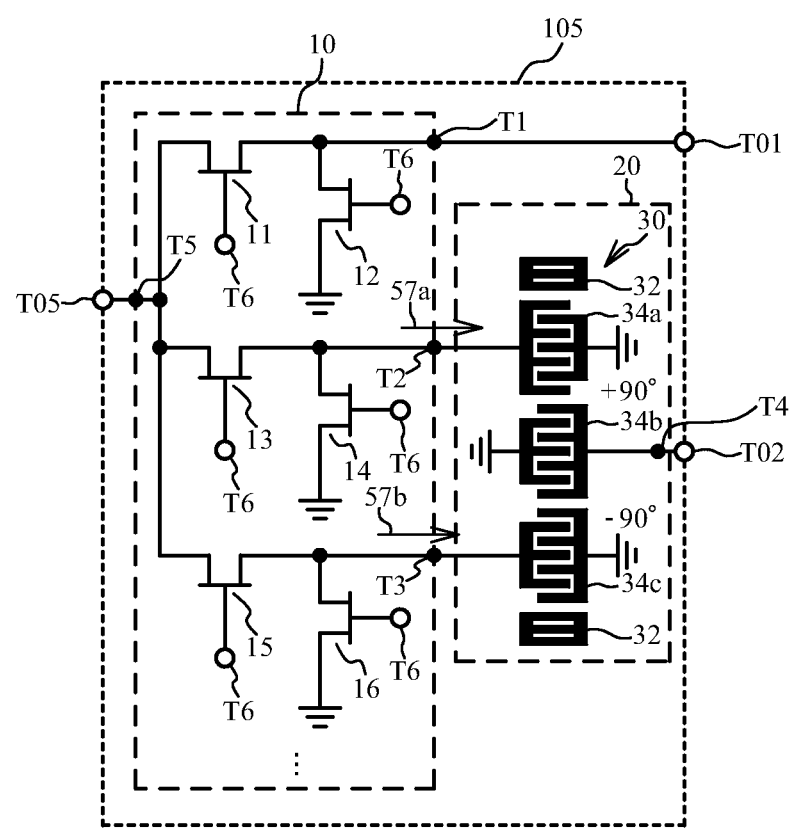
FIG. 15 is a circuit diagram of a switching device in accordance with a fifth embodiment.

A fifth embodiment uses an acoustic wave element for the compensating circuit. FIG. 15 is a circuit diagram of a switching device in accordance with the fifth embodiment. As illustrated in FIG. 15, the compensating circuit 20 includes an acoustic wave element 30 in a switching device 105. The acoustic wave element 30 includes reflectors 32 and IDTs 34a through 34c. The IDTs 34a through 34c are arranged between the reflectors 32 in the propagation direction of the acoustic wave. The IDT 34a is connected between the terminal T2 and a ground. The IDT 34b is connected between a ground and the terminal T4. The IDT 34c is connected between the terminal T3 and a ground.

The electrode fingers of the IDTs 34a and 34b are configured so that the phase of the signal 57a transmitted through the terminal T2 is shifted by 90° and the phase-shifted signal 57a is then output to the terminal T4. The electrode fingers of the IDTs 34b and 34c are configured so that the phase of the signal 57b transmitted through the terminal T3 is shifted by −90° and the phase-shifted signal 57b is then output to the terminal T4. As a result, signals having approximately opposite phases and the same amplitude are synthesized in the terminal T4. Therefore, as is the case with the first and second embodiments, the isolation from the input/output terminal T01 to the input/output terminal T02 can be improved. The other configuration is the same as the first embodiment, and a description thereof is omitted.

Figure 16:
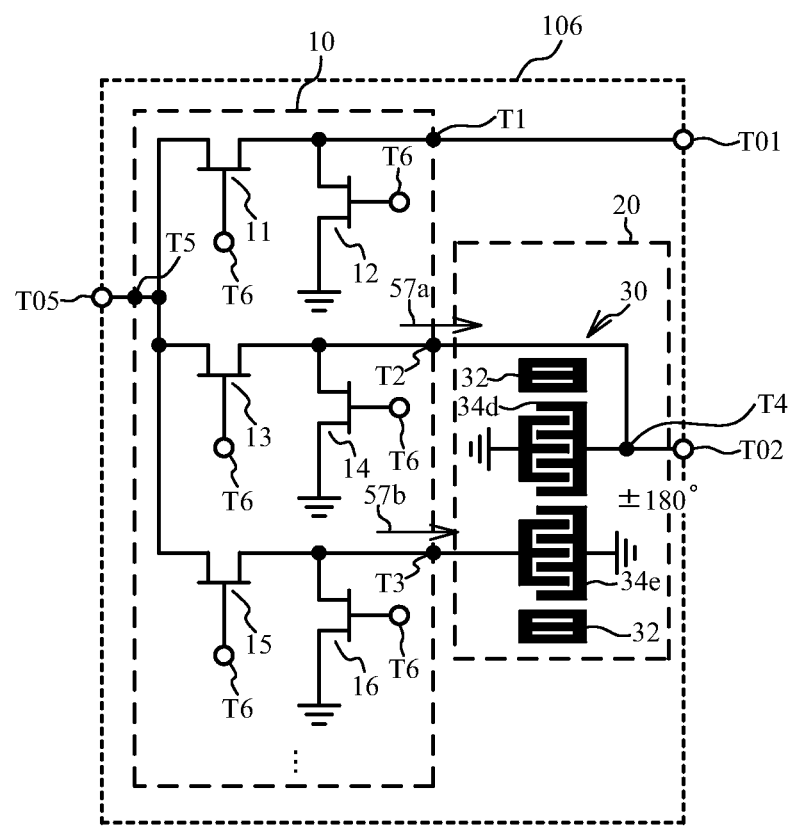
FIG. 16 is a circuit diagram of a switching device in accordance with a variation of the fifth embodiment.

FIG. 16 is a circuit diagram of a switching device in accordance with a variation of the fifth embodiment. As illustrated in FIG. 16, the acoustic wave element 30 includes the reflectors 32 and IDTs 34d through 34e in a switching device 106. The IDTs 34d and 34e are arranged between the reflectors 32 in the propagation direction of the acoustic wave. The IDT 34d is connected between a ground and the terminal T4. The IDT 34e is connected between the terminal T3 and a ground. The terminal T4 is connected to the terminal T2 without the acoustic wave element.

The signal 57a transmitted through the terminal T2 is output to the terminal T4 without the change in the phase. The electrode fingers of the IDTs 34d and 34e are configured so that the phase of the signal 57b transmitted through the terminal T3 is shifted by 180° and the phase-shifted signal 57b is then output to the terminal T4. As a result, signals having approximately opposite phases and the same amplitude are synthesized in the terminal T4. Therefore, as is the case with the third embodiment, the isolation from the input/output terminal T01 to the input/output terminal T02 is improved. The other configuration is the same as that of the first embodiment, and a description thereof is omitted.

As described in the fifth embodiment and the variation thereof, the compensating circuit 20 may use an acoustic wave element. This makes it possible to achieve a low-loss switching device because the compensating circuit 20 can be formed by using a reactance element having a high Q-value. The acoustic wave element may be a surface acoustic wave element, a boundary acoustic wave element, or a Love wave element. The acoustic wave element may be a piezoelectric thin film resonator element using thickness longitudinal vibration.

The second through fourth embodiments and the variations thereof may use an acoustic wave element for the compensating circuit 20.

Sixth Embodiment

Figure 17:
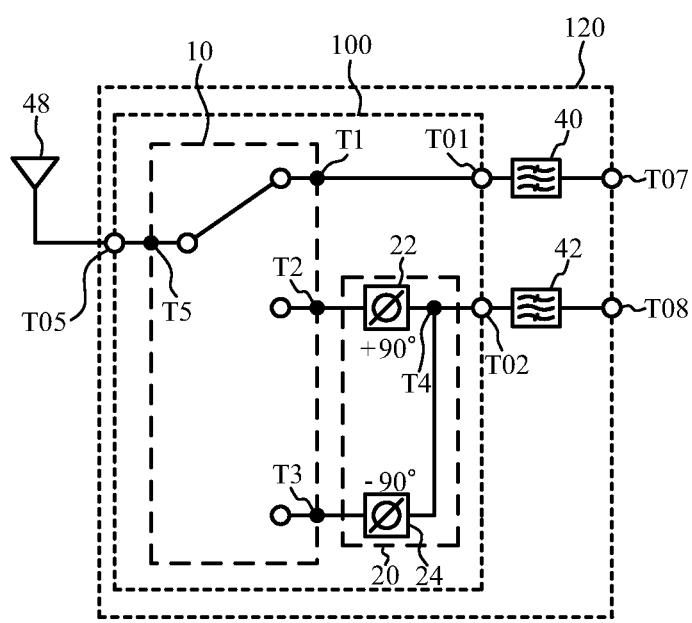
FIG. 17 is a block diagram of a module in accordance with a sixth embodiment.

A sixth embodiment is an exemplary module including the switching device of the first embodiment. FIG. 17 is a block diagram of a module in accordance with the sixth embodiment. As illustrated in FIG. 17, a module 120 includes the switching device 100 of the first embodiment and filters 40 and 42. The filter 40 is connected between the input/output terminal T01 and a terminal T07. The filter 42 is connected between the input/output terminal T02 and a terminal T08. The common terminal T05 is coupled to an antenna 48. Both the terminals T07 and T08 are transmit terminals or receive terminals, or one of them is a transmit terminal and the other is a receive terminal.

Figure 18:
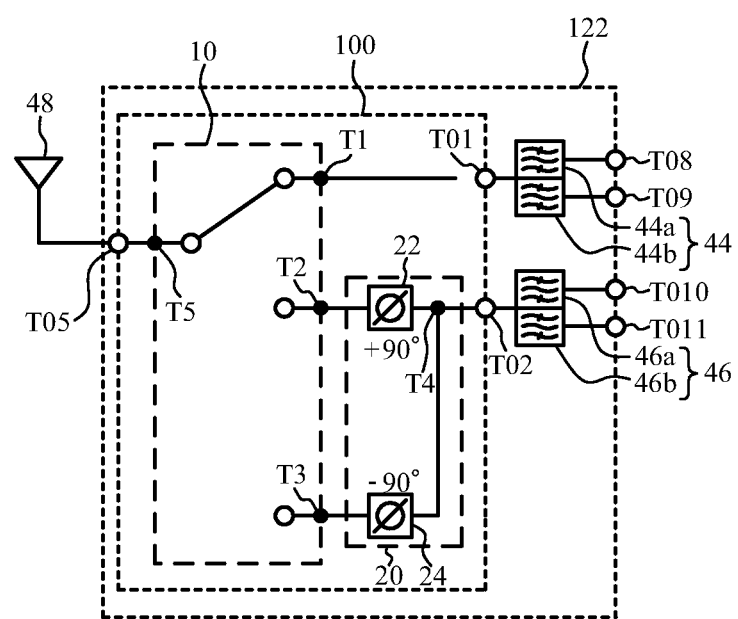
FIG. 18 is a block diagram of a module in accordance with a variation of the sixth embodiment.

FIG. 18 is a block diagram of a module in accordance with a variation of the sixth embodiment. As illustrated in FIG. 18, a module 122 includes the switching device 100 of the first embodiment and duplexers 44 and 46. The duplexer 44 includes a transmit filter 44a and a receive filter 44b. The transmit filter 44a is connected between the input/output terminal T01 and the terminal T08. The receive filter 44b is connected between the input/output terminal T01 and the terminal T09. The duplexer 46 includes a transmit filter 46a and a receive filter 46b. The transmit filter 46a is connected between the input/output terminal T02 and the terminal T10. The receive filter 46b is connected between the input/output terminal T02 and the terminal T11. The common terminal T05 is coupled to the antenna 48.

As described in the sixth embodiment and the variation thereof, the terminals T01 and T02 of any one of the switching devices of the first through fifth embodiments may be coupled to a filter or a duplexer. An acoustic wave filter may be used for a filter or a duplexer.

Although the embodiments of the present invention have been described in detail, it is to be understood that the various change, substitutions, and alterations could be made hereto without departing from the spirit and scope of the invention.

What is claimed is:

1. A switching device comprising:
   a switch that selects and connects one of at least three terminals including a first terminal, a second terminal, and a third terminal to a common terminal; and
   a compensating circuit that shifts a phase of at least one of a first signal transmitted through the second terminal and a second signal transmitted through the third terminal so that the first signal and the second signal compensate each other and unifies and outputs the first signal and the second signal to a fourth terminal as a third signal, or that branches a third signal input to the fourth terminal into the first signal and the second signal,
   wherein the switching device is configured to have at least either of the following features (a) or (b): (a) when the switch selects and connects the first terminal to the common terminal and when a fourth signal is input to the first terminal and output from the common terminal, each of the first signal and the second signal is a part of the fourth signal input to the first terminal and the compensating circuit unifies and outputs the first signal and the second signal to the fourth terminal as the third signal, or (b) when the switch selects and connects the first terminal to the common terminal and when a fourth signal is input to the common terminal and output from the first terminal, the compensating circuit branches the third signal input to the fourth terminal into the first signal and the second signal, and each of the first signal and the second signal is added into the fourth signal output from the first terminal.

2. The switching device according to claim 1, wherein the compensating circuit makes the first signal and the second signal have practically opposite phases.

3. A switching device comprising:
   a switch that selects and connects one of at least three terminals including a first terminal, a second terminal, and a third terminal to a common terminal; and
   a compensating circuit that shifts a phase of at least one of a first signal transmitted through the second terminal and a second signal transmitted through the third terminal so that the first signal and the second signal compensate each other and unifies and outputs the first signal and the second signal to a fourth terminal as a third signal, or that branches a third signal input to the fourth terminal into the first signal and the second signal,
   wherein the compensating circuit includes a phase inverting circuit located between the second terminal and the fourth terminal or between the third terminal and the fourth terminal and practically inverting a phase of the first signal or the second signal.

4. The switching device according to claim 1, wherein the compensating circuit includes:
   a first phase shifting circuit located between the second terminal and the fourth terminal and shifting a phase of the first signal; and
   a second phase shifting circuit located between the third terminal and the fourth terminal and shifting a phase of the second signal.

5. The switching device according to claim 1, wherein the compensating circuit includes an inductor and a capacitor.

6. The switching device according to claim 1, wherein the compensating circuit includes an acoustic wave element.

7. The switching device according to claim 1, wherein the switch is a semiconductor switch.

8. A module comprising: the switching device according to claim 1.

9. The switching device according to claim 1, wherein the first signal, the second signal and the third signal are high-frequency signals.

10. The switching device according to claim 1,
    wherein the switching device is configured to have at least either of the following features (a) or (b): (a) when the switch selects and connects the first terminal to the common terminal and when the fourth signal is input to the first terminal and output from the common terminal, each of the first signal and the second signal is the part of the fourth signal input to the first terminal leaked to the second terminal and the first terminal, or (b) when the switch selects and connects the first terminal to the common terminal and when the fourth signal is input to the common terminal and output from the first terminal, the compensating circuit branches the third signal input to the fourth terminal into the first signal and the second signal, and each of the first signal and the second signal leaked to the first terminal is added into the fourth signal output from the first terminal.

\* \* \* \* \*